US007429794B2

(12) United States Patent
Ryu et al.

(10) Patent No.: US 7,429,794 B2
(45) Date of Patent: Sep. 30, 2008

(54) MULTI-CHIP PACKAGED INTEGRATED CIRCUIT DEVICE FOR TRANSMITTING SIGNALS FROM ONE CHIP TO ANOTHER CHIP

(75) Inventors: Jung-su Ryu, Seongnam-si (KR); Byeong-yun Kim, Seoul (KR); Young-dae Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 402 days.

(21) Appl. No.: 11/157,500

(22) Filed: Jun. 21, 2005

(65) Prior Publication Data

US 2005/0280165 A1 Dec. 22, 2005

(30) Foreign Application Priority Data

Jun. 22, 2004 (KR) .................. 10-2004-0046560

(51) Int. Cl.
*H01L 23/34* (2006.01)
(52) U.S. Cl. ................ 257/724; 257/723; 257/E23.123
(58) Field of Classification Search ................ 257/723, 257/724, E23.123
See application file for complete search history.

(56) References Cited

U.S. PATENT DOCUMENTS

| 5,528,083 | A  | * | 6/1996  | Malladi et al. .............. 257/786 |
| 6,680,219 | B2 | * | 1/2004  | Reyes et al. ................. 438/109 |
| 6,731,011 | B2 | * | 5/2004  | Verma et al. ................ 257/777 |
| 6,972,487 | B2 |   | 12/2005 | Kato et al. .................. 257/723 |
| 7,148,563 | B2 | * | 12/2006 | So et al. ..................... 257/685 |
| 2003/0034563 | A1 | * | 2/2003 | Reyes et al. ................. 257/777 |
| 2003/0102569 | A1 | * | 6/2003 | Reyes et al. ................. 257/777 |
| 2003/0155659 | A1 | * | 8/2003 | Verma et al. ................ 257/777 |
| 2004/0120176 | A1 | * | 6/2004 | So et al. ...................... 365/51 |
| 2004/0169285 | A1 | * | 9/2004 | Verma et al. ................ 257/777 |
| 2005/0161794 | A1 |   | 7/2005 | Kato et al. .................. 257/686 |
| 2006/0065962 | A1 | * | 3/2006 | Narendra et al. ............ 257/686 |
| 2006/0118927 | A1 | * | 6/2006 | Verma et al. ................ 257/676 |
| 2007/0040280 | A1 | * | 2/2007 | So et al. ..................... 257/777 |
| 2007/0200224 | A1 | * | 8/2007 | Zhou et al. .................. 257/707 |

FOREIGN PATENT DOCUMENTS

| JP | 2002-76250    | 3/2002  |
| KR | 1999-0069438  | 9/1999  |
| KR | 1999-0069509  | 9/1999  |
| KR | 1999-0085110  | 12/1999 |
| KR | 2003-0036123  | 5/2003  |
| WO | 02/082540     | 10/2002 |

* cited by examiner

Primary Examiner—Ngan Ngo
(74) Attorney, Agent, or Firm—Mills & Onello LLP

(57) ABSTRACT

In a multi-chip packaged integrated circuit device for transmitting signals from one chip to another chip, in the case where not only a logic circuit of a first chip but also a logic circuit of a second chip requires an input signal, the multi-chip packaged integrated circuit device transmits the input signal to one or both of the logic circuits of the first and second chips via a synchronizer. In a case where three or more chips are integrated into the multi-chip packaged integrated circuit device, the input signal can be selectively transmitted to one or more of the three or more chips via the synchronizer.

20 Claims, 2 Drawing Sheets

MULTI-CHIP PACKAGED INTEGRATED CIRCUIT DEVICE FOR TRANSMITTING SIGNALS FROM ONE CHIP TO ANOTHER CHIP

This application claims the priority of Korean Patent Application No. 2004-46560, filed on Jun. 22, 2004, in the Korean Intellectual Property Office, the disclosure of which is incorporated herein in its entirety by reference.

BACKGROUND OF THE INVENTION

1. Field of the Invention

The present invention relates to an integrated circuit multi-chip package, and more particularly, to an integrated circuit multi-chip package and an integrated circuit device, in which an input signal input to one chip from an external source is transmitted to another chip.

2. Description of the Related Art

Operating speed and storage capacity of integrated circuits, such as semiconductor memory circuits, continues to increase at a dramatic pace. Along with this, the importance of package structure to the performance of an integrated circuit has steadily grown. In particular, a technique for effectively arranging and routing bonding pads considerably affects the performance of an integrated circuit. In general, in order to increase the performance of an integrated circuit device, a process known as multi-chip packaging is performed, wherein two or more integrated circuits are stacked and then packaged together.

FIG. 1 is a cross-sectional view of a conventional integrated circuit multi-chip package 10, and FIG. 2 is a plan view of the conventional integrated circuit multi-chip package 10. Referring to FIGS. 1 and 2, two or more chips, e.g., first and second chips 11 and 12, are stacked in the conventional integrated circuit multi-chip package 10, and pads on the chips 11 and 12 are electrically connected to bonding fingers 13 formed on a printed circuit board (PCB) substrate 16 by bonding wires 14. The bonding fingers 13 are electrically connected to external pins 15 via the PCB substrate 16.

The conventional integrated circuit multi-chip package 10 has a 'direct access' structure in which a signal is directly input to each chip stacked therein. In other words, pads of the first chip 11 are electrically connected to their respective external pins 15 so that they can receive signals from or transmit signals to their respective external pins 15. Likewise, pads of the second chip 12 are electrically connected to their respective external pins 15 so that they can receive signals from or transmit signals to their respective external pins 15. As marked by 'A' of FIG. 2, a signal may be directly transmitted from an external pin 15 to one of the pads of the first chip 11 and then transmitted from the corresponding pad of the first chip 11 to one of the pads of the second chip 12 via a bonding wire 14 connected therebetween. As long as the pads of the first and second chips 11 and 12 receive signals directly from the external pins 15, they are considered as being exposed to an external signal source or destination of the conventional integrated circuit multi-chip package 10, and thus, they should be connected to the static electricity protection circuit, in order to protect the chips 11, 12 from static electricity damage. In order to protect the first and second chips 11 and 12 from static electricity, the conventional integrated circuit multi-chip package 10 may further include a static electricity protection circuit (not shown), which is connected to the pads of the first and second chips 11 and 12, if the pads of the first chip 11 receive signals directly from the external pins 15 and then transmit the received signals to the pads of the second chip 12, as shown in 'A' of FIG. 2. This type of multi-chip package structure is disclosed in Korean Patent Publication No. KR1999-0085110.

When testing the conventional integrated circuit multi-chip package 10 having the 'direct access' structure described above, it is possible to freely adjust the timing of signals or the level of stress voltage for each of the external pins 15. However, it is difficult to synchronize a signal input to or output from the first chip 11 with a signal input to or output from the second chip 12. In addition, the conventional integrated circuit multi-chip package 10 requires a considerable number of external pins 15 to transmit signals to all of the first and second chips 11 and 12. Moreover, electrostatic defect (ESD)/electric overstress (EOS) tests should be performed on each chip of the conventional integrated circuit multi-chip package 10.

SUMMARY OF THE INVENTION

The present invention provides an integrated circuit multi-chip package and an integrated circuit device, which can reduce chip size and the number of external pins required and can readily synchronize a signal input to or output from a first chip with a signal input to or output from a second chip by transmitting an input signal to the second chip via the chip.

According to an aspect of the present invention, there is provided an integrated circuit device. The integrated circuit device includes: a first chip, that operates in response to an input signal that is received via a pad of the first chip; and a second chip, located in a same device package as the first chip, that operates in response to the input signal received from the first chip via a pad of the second chip.

In one embodiment, the first chip may include a static electricity protection circuit, which is connected to the pad of the first chip that receives the input signal, wherein no static electricity protection circuit is connected to the pad of the second chip that receives the input signal from the first chip.

In another embodiment, the first chip may include a synchronizer, which receives the input signal via the pad of the first chip, selects at least one of the first and second chips in response to a control signal, and transmits the input signal to the selected chips.

In another embodiment, the synchronizer synchronizes the input signal with a clock signal and outputs the synchronized signal.

In another embodiment, the synchronized signal output from the synchronizer is input to the pad of the second chip via a pad of the first chip.

In another embodiment, the first chip comprises a static electricity protection circuit, which is connected to the pad of the first chip that receives the input signal, and wherein no static electricity protection circuit is connected to the pad of the second chip that receives the synchronized signal output from the synchronizer.

In another embodiment, the pad of the first chip that receives the synchronized signal from the synchronizer is connected to an external pin.

In another embodiment, the integrated circuit device further comprises: a plurality of chips, which receive the input signal from the first chip via their respective pads and which operate in response to the received input signal.

In another embodiment, the first chip comprises a synchronizer, which receives the input signal via the pad of the first chip, selects at least one of the first and second chips and the plurality of chips in response to a control signal, and transmits the input signal to the selected chips.

In another embodiment, the synchronizer synchronizes the input signal with a clock signal and outputs the resulting input signal.

According to another aspect of the present invention, there is provided an integrated circuit package. The integrated circuit package includes: first bonding pads provided at a first chip; second bonding pads provided at a second chip; bonding fingers, which are electrically connected to external pins; first bonding wires, which electrically connect the first pads to respective bonding fingers; second bonding wires, which electrically connect the second pads to respective bonding fingers; and at least one third bonding wire coupled between at least one of the first bonding pads of the first chip and at least one of the second bonding pads of the second chip, the at least one of the first bonding pads receiving an input signal through another of the first bonding pads that is distributed to the at least one of the first bonding pads via a circuit on the first chip.

The first chip may include a static electricity protection circuit, which is connected to the at least one of the first bonding pads, and wherein the second chip has no static electricity protection circuit connected to that at least one of the second pads that receive the input signal from the first chip via the at least one third bonding wire.

The first chip may include a synchronizer, which receives the input signal from the at least one of the first bonding pads, selects at least one of the first and second chips in response to a control signal, and transmits the input signal to the at least one selected chips.

The synchronizer may synchronize the input signal with a clock signal and then outputs the synchronized signal.

The first chip may include a static electricity protection circuit, which is connected to the at least one of the first bonding pads that receives the input signal, and wherein the second chip has no static electricity protection circuit connected to the at least one of the second pads that receive the synchronized signal from the synchronizer via the at least one third bonding wire.

The at least one of the first bonding pads may be connected to an external pin.

The integrated circuit package may also include a plurality of chips, which receive the input signal from the first chip via their respective pads and operate in response to the received input signal.

The first chip may include a synchronizer, which receives the input signal from the at least one of the first bonding pads, selects at least one of the first and second chips and the plurality of chips in response to a control signal, and transmits the input signal to the selected chips.

The synchronizer may synchronize the input signal with a clock signal and output the resulting input signal.

BRIEF DESCRIPTION OF THE DRAWINGS

The above and other features and advantages of the present invention will become more apparent by describing in detail an exemplary embodiment thereof with reference to the attached drawings in which.

DETAILED DESCRIPTION OF THE INVENTION

Figure 1:
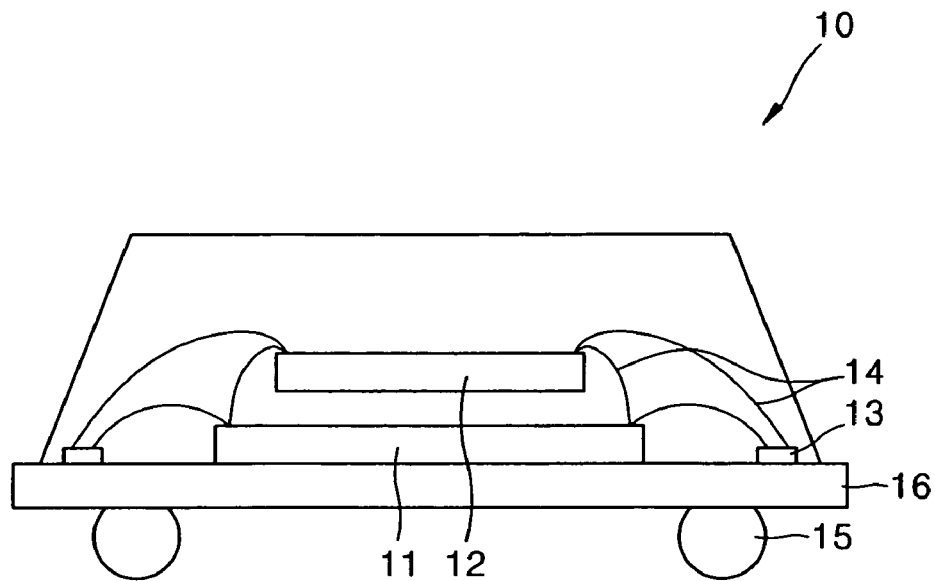
FIG. 1 is a cross-sectional view of a conventional integrated circuit multi-chip package.
Figure 2:
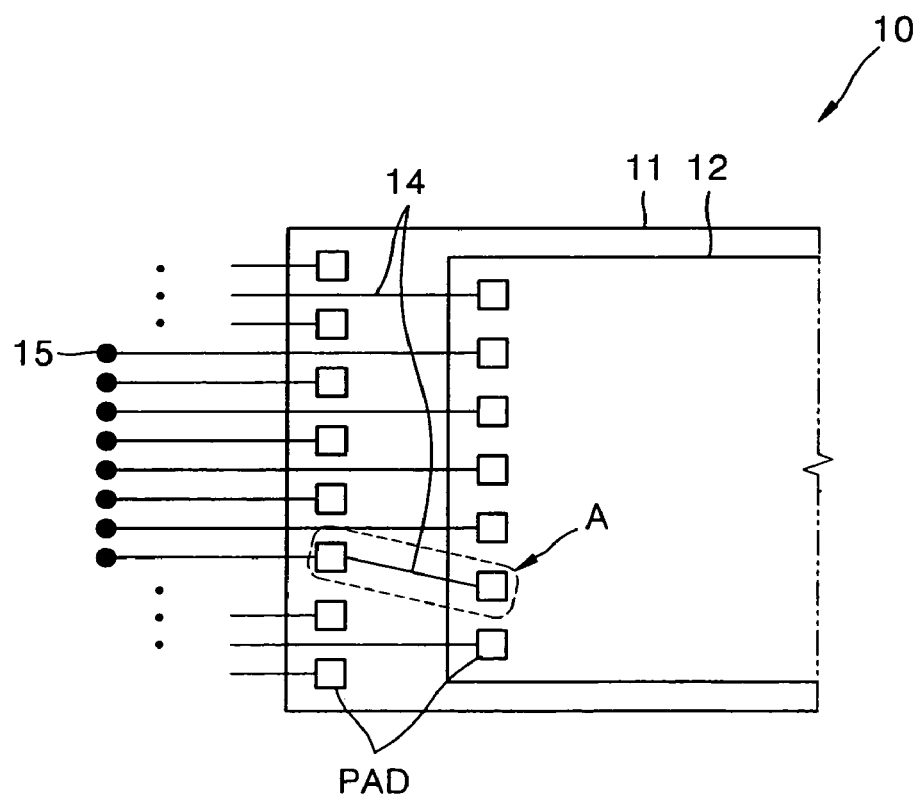
FIG. 2 is a plan view of the conventional integrated circuit multi-chip package of FIG. 1.

The present invention will now be described more fully with reference to the accompanying drawings, in which an exemplary embodiment of the invention is shown. In the drawings, like reference numerals represent like elements.

Figure 3:
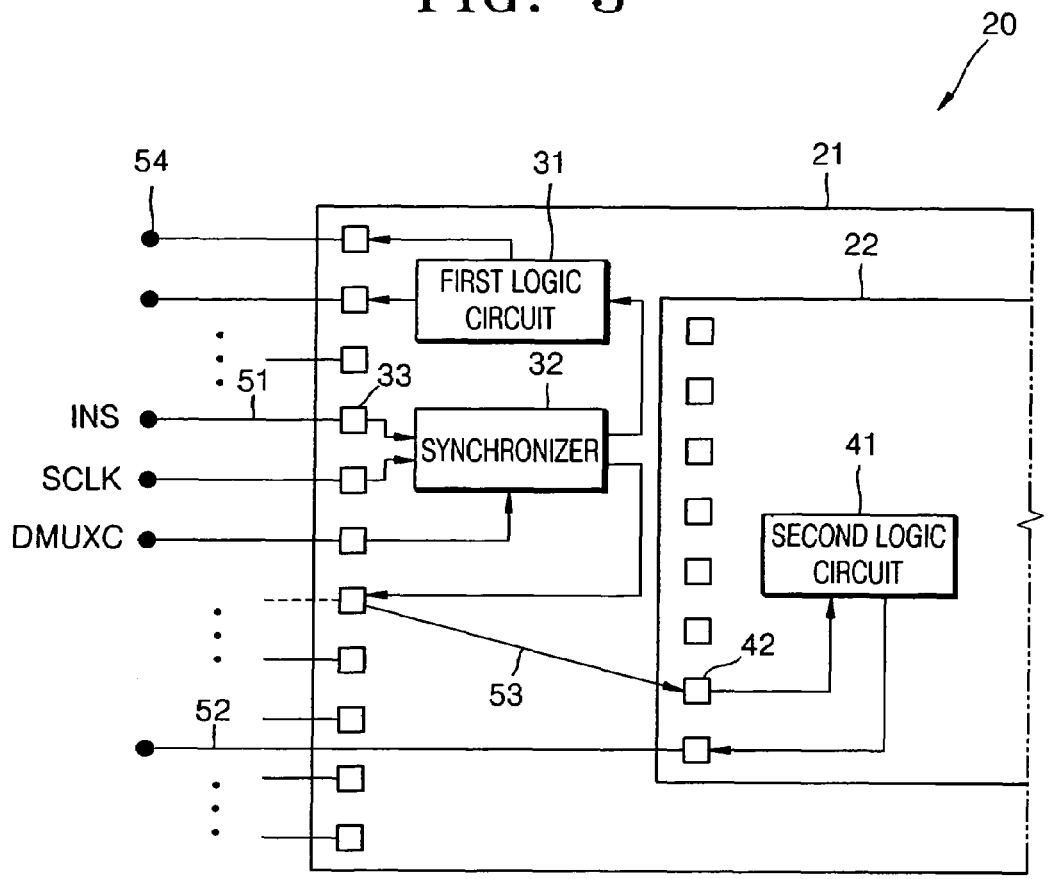
FIG. 3 is a plan view of an integrated circuit multi-chip package/integrated circuit device according to an exemplary embodiment of the present invention.

FIG. 3 is a plan view of an integrated circuit multi-chip package/integrated circuit device 20 according to an exemplary embodiment of the present invention. The integrated circuit multi-chip package/integrated circuit device 20 includes first and second chips 21 and 22. The first chip 21 includes first pads 33, and the second chip 22 includes second pads 42. The integrated circuit multi-chip package/integrated circuit device 20 further includes bonding fingers (not shown), first bonding wires 51, second bonding wires 52, and third bonding wires 53.

The first chip 21 receives an input signal INS via the first pads, i.e., a first pad 33. Since the first pads 33 are electrically connected to the respective bonding fingers via the first bonding wires 51, they transmit the input signal INS received from external pins 54 to the first chip 21. As described above with reference to FIG. 1, the bonding fingers are electrically connected to the external pins 54 via a PCB substrate. A first logic circuit 31, which constitutes the first chip 21, operates in response to the input signal INS. In FIG. 3, only one input signal INS is illustrated as being input to the first chip 21 via the first pad 33. However, the first logic circuit 31 may operate in response to a plurality of input signals input to the first chip 21 via the first pads 33. Likewise, signals output from the first logic circuit 31 may be transmitted to the external pins 54 via the first pads 33. Preferably, but not necessarily, the external pins 54 are ball grid arrays. A synchronizer 32, provided on the first chip 21, may simultaneously or selectively transmit the input signal INS input thereto via the first pads 33 to the first logic circuit 31 of the first chip 21, a second logic circuit 41 of the second chip 22, and another chip. The synchronizer 32 will be described in further detail below with reference to FIG. 4.

At least one of the second pads 42 of the second chip 22 receives the input signal INS that passes through the synchronizer 32. In other words, the at least one of the second pads 42 of the second chip 22 receives the input signal INS from the respective first pad(s) 33 of the first chip 21 via the respective third bonding wire(s) 53. More specifically, the input signal INS is input to at least one of the first pads 33 of the first chip 21 may be transmitted to other first pad(s) 33 of the first chip 21. The third bonding wires 53 electrically connect some of the first pads 33 via which the input signal INS is transmitted to the second chip 22 to the respective second pads 42. As shown in FIG. 3, the other first pads 33 that receive the input signal INS from the at least one of the first pads 33 via the synchronizer 32 may be connected to the respective external pins 54.

Some of the second pads 42 provided at the second chip 22 are electrically connected to the respective bonding fingers by the second bonding wires 52 such that they can receive the input signal INS directly from the respective external pins 54. The second logic circuit 41 of the second chip 22 operates in response to the input signal INS input thereto via the third or second bonding wires 53 or 52. As a result of the operation of the second logic circuit 41, signals may be output to the external pins 54 via at least one of the second pads 42.

In a case where the first chip 21 receives the input signal INS from the external pins 54 via some of the first pads 33 directly connected to the external pins 54 via the first bonding wires 51, and the second chip 22 receives the input signal INS from the external pins via some of the second pads 42 directly connected to the external pins via the second bonding wires 52, a static electricity protection circuit is connected to some of the first or second pads 33 or 42, via which the first or second chip 21 or 22 receives the input signal INS from the external pins 54, in order to prevent electrostatic defects from being generated. The static electricity protection circuit prevents the first or second chip 21 or 22 from breaking down due to a high electrostatic voltage originating from a source external to the integrated circuit multi-chip package/integrated circuit device 20. Therefore, the static electricity protection circuit is connected to some of the first pads 33, through which the first chip 21 receives the input signal INS from the external pins 54. However, it is unnecessary to connect the static electricity protection circuit to some of the second pads 42, which are connected to the respective first pads 33 via the third bonding wires 53 such that the second chip 22 receives the input signal INS via the third bonding wires 53.

Figure 4:
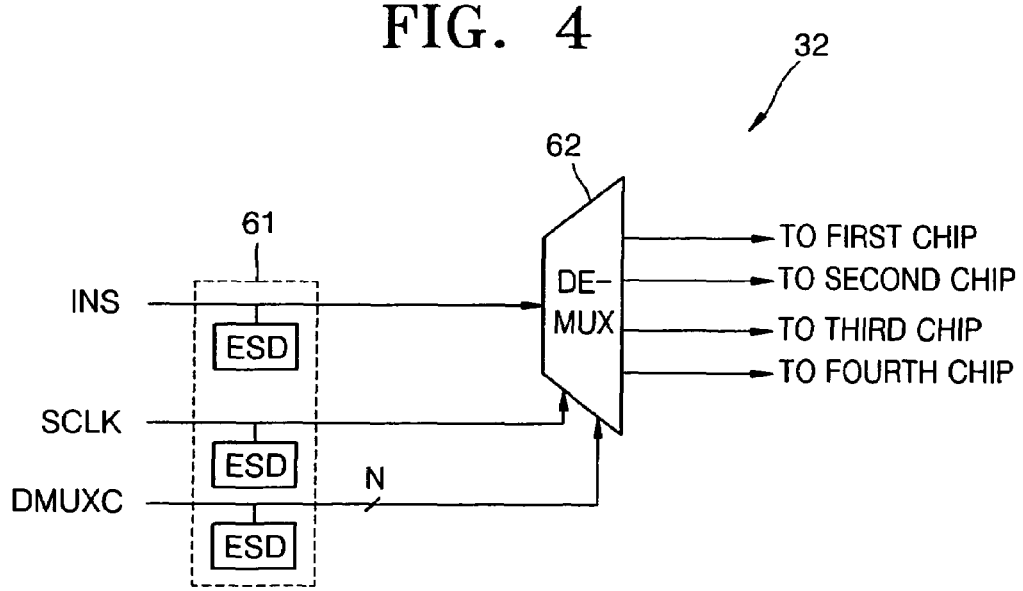
FIG. 4 is a block diagram of the synchronizer of FIG. 3, in accordance with the present invention.

FIG. 4 is a block diagram of an example of the synchronizer 32 of FIG. 3. Referring to FIG. 4, the synchronizer 32 includes a demultiplexer 62 and can selectively transmit the input signal INS input via the first pads 33 to any of a plurality of chips included in the integrated circuit multi-chip package/integrated circuit device 20. For example, supposing that the integrated circuit multi-chip package/integrated circuit device 20 includes four chips, the synchronizer 32 can select at least one of the four chips in response to a chip selection control signal DMUXC which is N bits long and then can transmit the input signal INS to the selected chip(s). The synchronizer 32 can simultaneously transmit the input signal INS to all of the plurality of chips included in the integrated circuit multi-chip package/integrated circuit device 20, in which case, the first chip 21 may be designed, without the need to install the demultiplexer 62 in the synchronizer 32, so that the input signal INS input via at least one of the first pads 33 can be transmitted to other first pad(s) 33 via interconnections in the first chip 21. In this case, the third bonding wire(s) 53 electrically connects the other first pad(s) 33 that receive the input signal INS from the at least one of the first pads 33 to the respective second pad(s) 42 so that a signal output from the synchronizer 32 can be input from the at least one of the first pads 33 to the respective second pad(s) 42 via the other first pad(s) 33.

A static electricity protection circuit 61 is connected to some of the first pads 33 connected to the first bonding wires 51 and to some of the second pads 42 connected to the second bonding wires 52, in order to prevent electrostatic defects. Referring to FIG. 4, the static electricity protection circuit 61 is connected to a plurality of pads that respectively receive the input signal INS, a clock signal SCLK, and the chip selection control signal DMUXC. The synchronizer 32 synchronizes the input signal INS, which is to be transmitted to chips, with the clock signal SCLK. The clock signal SCLK is used as a reference signal, with which the input signal INS is compared or synchronized when testing or operating the integrated circuit multi-chip package/integrated circuit device 20.

Even though the static electricity protection circuit 61 is connected to the plurality of pads that respectively receive the input signal INS, the clock signal SCLK, and the chip selection control signal DMUXC, it is unnecessary to install another static electricity protection circuit to be connected to a plurality of pads of the second chip 22, which receive the input signal INS via the bonding wires 53, because the plurality of pads of the second chip 22 are not exposed to an external signal source or destination the integrated circuit multi-chip package/integrated circuit device 20.

As described above, if not only the first logic circuit 31 but also the second logic circuit 51 requires access to the input signal INS, the integrated circuit multi-chip package/integrated circuit device 20 simultaneously transmits the input signal INS to the first and second logic circuits 31 and 41 via the synchronizer 32. In a case where three or more chips are integrated into the integrated circuit multi-chip package/integrated circuit device 20, the input signal INS can be selectively transmitted to the three or more chips via the synchronizer 32.

As described above, the integrated circuit multi-chip package/integrated circuit device 20 has a structure in which an input signal is transmitted from a first chip having a synchronizer to a second chip. Thus, it is possible to synchronize a signal input to or output from the first chip with a signal input to or output from the second chip. In addition, it is unnecessary to install a static electricity protection circuit at pads of the second chip, and thus it is possible to reduce chip size. Moreover, no bonding wires are required to connect the pads of the second chip to the respective bonding fingers. Thus, it is possible to reduce the number of external pins required, and to increase the pitch between external pins. Therefore, the integrated circuit multi-chip package/integrated circuit device 20 of the present invention is suitable for use with a fine-pitch substrate. Furthermore, it is possible to reduce the number of bonding wires required. Thus, it is possible to stabilize an input signal by reducing power noise and coupling noise that can be caused by signal lines in close proximity with each other.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit device comprising:
    a first chip, that operates in response to an input signal, that is received at a pad of the first chip; and
    a second chip, located in a same device package as the first chip, that operates in response to the input signal received from the first chip via a pad of the second chip, wherein the first chip includes a synchronizer that transmits the input signal to at least one of the first chip and the second chip.

2. The integrated circuit device of claim 1, wherein the first chip comprises a static electricity protection circuit, which is connected to the pad of the first chip that receives the input signal, and wherein no static electricity protection circuit is connected to the pad of the second chip that receives the input signal from the first chip.

3. The integrated circuit device of claim 1, wherein the synchronizer receives the input signal via the pad of the first chip, selects at least one of the first and second chips in response to a control signal, and transmits the input signal to the selected chips.

4. The integrated circuit device of claim 3, wherein the synchronizer synchronizes the input signal with a clock signal and outputs the synchronized signal.

5. The integrated circuit device of claim 3, wherein the synchronized signal output from the synchronizer is input to the pad of the second chip via a pad of the first chip.

6. The integrated circuit device of claim 5, wherein the first chip comprises a static electricity protection circuit, which is connected to the pad of the first chip that receives the input signal, and wherein no static electricity protection circuit is connected to the pad of the second chip that receives the synchronized signal output from the synchronizer.

7. The integrated circuit device of claim 6, wherein the pad of the first chip that receives the synchronized signal from the synchronizer is connected to an external pin.

8. The integrated circuit device of claim 1 further comprising:
a plurality of chips, which receive the input signal from the first chip via their respective pads and which operate in response to the received input signal.

9. The integrated circuit device of claim 8, wherein the first chip comprises a synchronizer, which receives the input signal via the pad of the first chip, selects at least one of the first and second chips and the plurality of chips in response to a control signal, and transmits the input signal to the selected chips.

10. The integrated circuit device of claim 9, wherein the synchronizer synchronizes the input signal with a clock signal and outputs the resulting input signal.

11. An integrated circuit package comprising:
first bonding pads, provided at a first chip;
second bonding pads, provided at a second chip;
bonding fingers, which are electrically connected to external pins;
first bonding wires, which electrically connect the first bonding pads to respective bonding fingers;
second bonding wires, which electrically connect the second bonding pads to respective bonding fingers; and
at least one third bonding wire coupled between at least one first bonding pad of the first bonding pads of the first chip and at least one of the second bonding pads of the second chip, the at least one first bonding pad of the first bonding pads receiving an input signal from a second bonding pad of the first bonding pads, the input signal distributed to the at least one first bonding pad of the first bonding pads via a synchronizer on the first chip; wherein the synchronizer transmits the input signal to at least one of the first chip and the second chip.

12. The integrated circuit package of claim 11, wherein the first chip comprises a static electricity protection circuit, which is connected to the at least one second bonding pad of the first bonding pads, and wherein the second chip has no static electricity protection circuit connected to at least one of the second pads that receive the input signal from the first chip via the at least one third bonding wire.

13. The integrated circuit package of claim 11, wherein the synchronizer receives the input signal from the second bonding pad of the first bonding pads, selects at least one of the first and second chips in response to a control signal, and transmits the input signal to the at least one selected chips.

14. The integrated circuit package of claim 13, wherein the synchronizer synchronizes the input signal with a clock signal and then outputs the synchronized signal.

15. The integrated circuit package of claim 13, wherein the synchronized signal output from the synchronizer is input to the at least one of the second bonding pads of the second chip via the at least one of the first bonding pads of the first chip.

16. The integrated circuit package of claim 15, wherein the first chip comprises a static electricity protection circuit, which is connected to the at least one of the first bonding pads that receives the input signal, and wherein the second chip has no static electricity protection circuit connected to the at least one of the second pads that receive the synchronized signal from the synchronizer via the at least one third bonding wire.

17. The integrated circuit package of claim 6, wherein the at least one second bonding pad of the first bonding pads is connected to an external pin.

18. The integrated circuit package of claim 11 further comprising:
a plurality of chips, which receive the input signal from the first chip via their respective pads and operate in response to the received input signal.

19. The integrated circuit package of claim 18, wherein the synchronizer receives the input signal from the at least one second bonding pad of the first bonding pads, selects at least one of the first and second chips and the plurality of chips in response to a control signal, and transmits the input signal to the selected chips.

20. The integrated circuit package of claim 19, wherein the synchronizer synchronizes the input signal with a clock signal and then outputs the resulting input signal.

* * * * *